US012025645B2

(12) United States Patent
Mathes et al.

(10) Patent No.: US 12,025,645 B2
(45) Date of Patent: Jul. 2, 2024

(54) TESLA COIL PULSE DETECTOR AND ALERT

(71) Applicant: Precision Measurement Technologies, LLC, Clearwater, FL (US)

(72) Inventors: Robert W. Mathes, Gulfport, FL (US); Ronald William Fialko, Cincinnati, OH (US); John Robert Monteith, New Port Richey, FL (US)

(73) Assignee: Precision Measurement Technologies, LLC, Clearwater, FL (US)

( * ) Notice: Subject to any disclaimer, the term of this patent is extended or adjusted under 35 U.S.C. 154(b) by 127 days.

(21) Appl. No.: 17/968,686

(22) Filed: Oct. 18, 2022

(65) Prior Publication Data

US 2023/0138077 A1    May 4, 2023

Related U.S. Application Data

(60) Provisional application No. 63/275,699, filed on Nov. 4, 2021.

(51) Int. Cl.
*G01R 29/12* (2006.01)
*G08B 5/36* (2006.01)
*H02J 50/10* (2016.01)

(52) U.S. Cl.
CPC ............... *G01R 29/12* (2013.01); *G08B 5/36* (2013.01); *H02J 50/10* (2016.02)

(58) Field of Classification Search
CPC ...... G01R 29/12; G01R 29/0842; G08B 5/36; G08B 21/00; H02J 50/10
See application file for complete search history.

(56) References Cited

U.S. PATENT DOCUMENTS

| | | |
|---|---|---|
| 3,891,919 A | 6/1975 | Penniger |
| 4,272,720 A | 6/1981 | Lennon |
| 5,263,368 A | 11/1993 | Breitmeier et al. |
| 5,541,501 A | 7/1996 | Shaver et al. |
| 7,049,972 B2 | 5/2006 | Fabian et al. |
| 7,254,484 B2 | 8/2007 | Jantunen et al. |
| 7,266,455 B2 | 9/2007 | Kahkoska |
| 7,327,271 B2 | 2/2008 | Greenstein et al. |
| 7,772,826 B2 | 8/2010 | Jantunen et al. |
| 8,275,548 B2 | 9/2012 | Marshall et al. |

(Continued)

*Primary Examiner* — Jermele M Hollington
*Assistant Examiner* — Zannatul Ferdous
(74) *Attorney, Agent, or Firm* — Larry K. Roberts (57) ABSTRACT

A portable electronic device for detecting an electromagnetic pulse generated by a tesla coil, and selectively a pulse from natural lightning. The device has a detection circuit for electromagnetic pulses, operating to detect an observed electromagnetic pulse having a frequency at least within a range of about 50 kilohertz (kHz) to about 300 megahertz (MHz). The detection circuit generate an output signal corresponding to the observed electromagnetic pulse. A microcontroller analyzes the output signal from the detection circuit against a tesla profile that identifies a detected electromagnetic pulse as a tesla coil pulse when the observed electromagnetic pulse has a frequency within the range of about 50 kHz to about 300 MHz with a pulse duration of at least 0.50 seconds. The microcontroller then generates an indication that the detected electromagnetic pulse is that of a tesla coil, and generates a tesla coil alert, typically flashing of an LED.

16 Claims, 6 Drawing Sheets

(56) References Cited

U.S. PATENT DOCUMENTS

| | | | |
|---|---|---|---|
| 2003/0151398 A1 | 8/2003 | Murphy et al. | |
| 2007/0020701 A1* | 1/2007 | Menon | G01R 33/34053 |
| | | | 435/7.5 |
| 2009/0164124 A1 | 6/2009 | Ryan et al. | |
| 2011/0130618 A1* | 6/2011 | Ron Edoute | A61N 1/328 |
| | | | 601/3 |
| 2012/0154971 A1 | 6/2012 | Brashear | |
| 2015/0018638 A1* | 1/2015 | Shames | A61B 5/14542 |
| | | | 600/301 |
| 2019/0344076 A1* | 11/2019 | Irazoqui | G02C 7/04 |

\* cited by examiner

TESLA COIL PULSE DETECTOR AND ALERT

CROSS-REFERENCE TO RELATED APPLICATION

This application claims priority to U.S. Provisional Patent Application No. 63/275,699, filed Nov. 4, 2021, the entire contents of which are incorporated herein by this reference.

BACKGROUND

Naturally occurring lightning generally has a multiplicity of frequencies in the range of 10 kilohertz (kHz) to 30 megahertz (MHz). Most lightning detectors monitor a narrow frequency range, and detect lightning by its characteristic pulse durations of between 10 milliseconds (msec) to 250 msec. The 500 kHz frequency is a relatively "quiet" range, so many lightning detectors monitor activity at or around the 500 KHz frequency. The characteristics of natural lighting are described in ED-84(28).

Most conventional lightning detectors operate with an algorithm that labels activity as "lightning" if the duration of a pulse falls within the 10-250 msec range. The programming will also send the operator an alert if activity is detected having a longer duration, above about 250 msec, which is labeled a "disturber" because the longer pulse durations can overlap with natural lightning pulses, and block their detection. The alert will typically ask the operator to relocate the lightning detector in a new location, perhaps further away from a suspected disturber source.

A typical tesla coil signal is more stable and constant in terms of frequency, pulse duration, and amplitude, than is natural lighting. A typical tesla coil will produce an electromagnetic pulse signal or signals that overlaps with the frequency range of natural lighting, within a range of 50 kHz to 300 MHz, more typically within the range of 50 kHz to 30 MHz, but with a pulse duration that is typically longer than 250 msec, which is the upper pulse duration of natural lighting, and well more than 0.5 seconds, and more typically of one or more seconds.

Notwithstanding, conventional lightning detectors are not effective or efficient in also detecting an electromagnetic pulse from a tesla coil pulse generator.

SUMMARY OF THE INVENTION

The present invention provides a portable electronic device for detecting an electromagnetic pulse generated by a tesla coil, and activating an alert.

The present invention provides a portable electronic device for detecting an electromagnetic pulse generated by a tesla coil, comprising: a detection circuit for an electromagnetic pulse, operating to detect an observed electromagnetic pulse having a frequency at least within a range of 50 kilohertz (kHz) to 300 megahertz (MHz), and to generate an output signal corresponding to the observed electromagnetic pulse, and a microcontroller coupled to the detection circuit, the microcontroller operating to analyze the output signal from the detection circuit against a tesla profile that identifies a detected electromagnetic pulse as a tesla coil pulse when the observed electromagnetic pulse has a frequency within the range of 50 kHz to 300 MHz with a pulse duration of at least 0.50 seconds, and to generate an indication of the detected electromagnetic pulse, the indication comprising a tesla coil indication.

In various embodiments, the portable electronic device further includes an alert comprising a tesla coil alert that is actuated when the indication is a tesla coil indication, non-limiting examples of which can be selected from the group consisting of a light, a light-emitting diode (LED), a buzzer, a gauge, a horn, a vibrator, a shaker, and a combination thereof, to provide visual, audible, or tactile feedback.

In various embodiments, the detection circuit can further operate to detect an observed electromagnetic pulse corresponding to natural lightning, and the microcontroller further operates to analyze the output signal from the detection circuit against a lightning profile that identifies the detected electromagnetic pulse as natural lightning, and to generate a lightning indication. In some embodiments, the lightning profile identifies the detected electromagnetic pulse as natural lightning when the observed electromagnetic pulse has a pulse duration within a range of 10 to 250 milliseconds (msec), and/or when the observed electromagnetic pulse has pulse frequencies that include frequencies within a range from 10 kHz to 300 MHz, 10 kHz to about 600 kHz, including about 450 to about 550 kHz, and more typically about 500±17 kHz.

In various embodiments, the portable electronic device further includes an indication selector for selecting either a tesla coil position or a lightning position, wherein when the indication selector is in the tesla coil position, a generated tesla coil indication activates a tesla coil alert when a tesla coil pulse is detected, and when the indication selector is in the lightning position, a generated lightning indication activates a lightning alert when a natural lightning pulse is detected. In some embodiments, when the indication selector is in the tesla coil position, a generated tesla coil indication activates a tesla coil alert when a tesla coil pulse is detected, but does not activate the lightning alert when a natural lightning pulse is detected; and when the indication selector is in the lightning position, a generated lightning indication activates a lightning alert when a natural lightning pulse is detected, but does not activate the tesla coil alert when a tesla coil pulse is detected.

In various embodiments, the microcontroller of the portable electronic device further operates to analyze an amplitude of the output signal from the detection circuit to provide an estimate of the distance of the detected electromagnetic pulse of natural lightning. In various embodiments, the microcontroller compares the amplitude of the output signal from the detection circuit to two or more predetermined sets of amplitudes, each set representing a respective range of estimated distances of the detected electromagnetic pulse of natural lightning from the position or location of the portable electronic device itself. In some embodiments, the microcontroller includes at least three predetermined sets of amplitudes, corresponding to at least three ranges of estimated distances detected electromagnetic pulse of natural lightning, where the first set of amplitudes comprises a farthest range of estimated distance, the second set of amplitudes comprises an intermediate range of estimated distance, and the third set of amplitudes comprises a closest range of estimated distance detected electromagnetic pulse of natural lightning.

The present invention also provides a method for detecting an electromagnetic pulse generated by a tesla coil, comprising the steps of: detecting an observed electromagnetic pulse at least within a range of 50 kilohertz (kHz) to 300 megahertz (MHz), and having a pulse duration; generating an output signal corresponding to the observed electromagnetic pulse; analyzing the output signal against a tesla profile that identifies the detected electromagnetic pulse as a tesla coil pulse when the observed electromagnetic pulse has a frequency within the range of 50 kHz to 30 MHz with a pulse duration of at least 0.50 seconds; generating an indication comprising a tesla coil indication; and actuating an alert comprising a tesla coil alert when the indication is the tesla coil indication.

In various embodiments, the method further provides for detecting natural lightning and distinguishing an observed electromagnetic pulse of an electromagnetic pulse generated by a tesla coil from natural lighting, wherein: the step of analyzing the output signal further includes analyzing the output signal against a lightning profile that identifies the detected electromagnetic pulse as natural lightning when the observed electromagnetic pulse has a pulse duration within a range of 10 to 250 milliseconds (msec); generating a lightning indication; and actuating a lightning alert when the indication comprises the lightning indication.

In various embodiments, the step of actuating further includes providing a means for selecting either a tesla coil indication or a lightning indication, wherein when the tesla coil indication is selected, only the tesla coil alert is actuated, and when the lightning indication is selected, only the lightning alert is actuated.

DETAILED DESCRIPTION OF THE INVENTION

Figure 1:
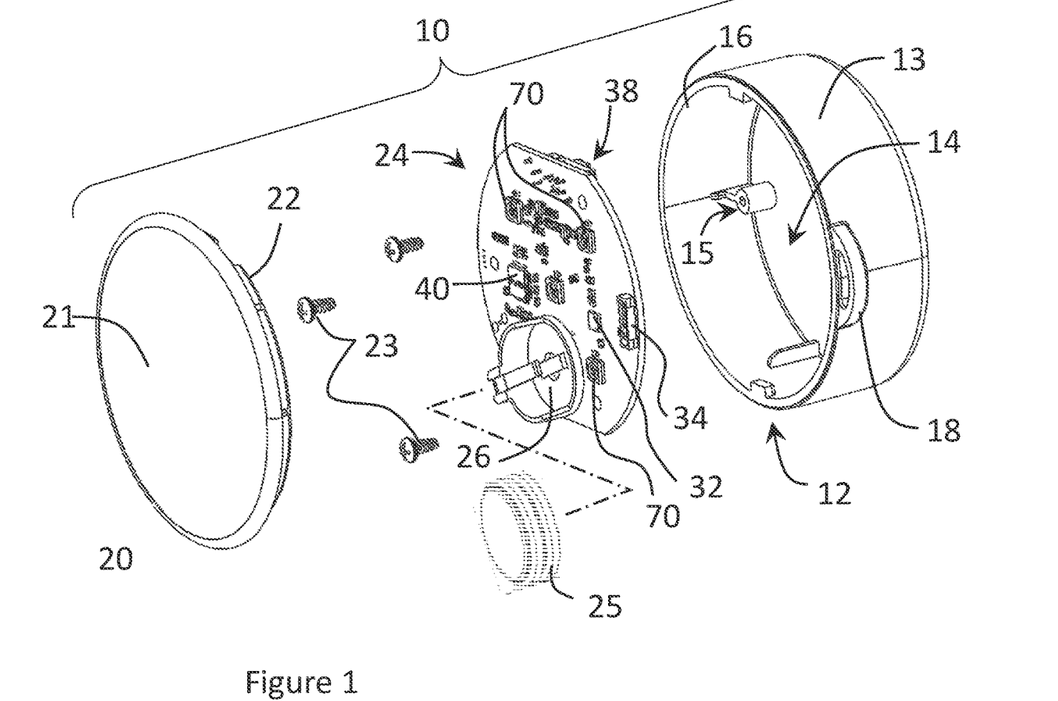
FIG. 1 shows an exploded, perspective view of a tesla coil pulse detector, including a housing, a PCB (printed circuit board) with a detection circuit, microcontroller, and a battery power source, a lens that attaches to the housing and encloses the PCB, and a tesla coil alert.

FIG. 1 shows an exploded, perspective view of a tesla coil pulse detector 10, including a housing 12, a PCB (printed circuit board) 24 with a detection circuit 32, an antenna 34, a microcontroller 40, and a power supply 26, a lens 20 that, attaches to the housing 12 and encloses the PCB 24, and a plurality of LED lights 70, which can include a tesla coil alert 72. A battery power source 25, illustrated as a pair of coin-type batteries 25 (for example, two CR2032 batteries in series), are insertable into the power supply 26, to supply power for the pulse detector 10, including the microcontroller 40, detector circuits 32, and the LED lights 70.

The housing 12 is illustrated as a circular container having a circular base 14 and peripheral wall 13 having an upper circular edge 16. The housing also includes a means for securing the PCB 24, illustrated as one or more threaded posts 15, for receiving a securement that engages the securing means for securing the PCB 24 into the housing 12, illustrated as threaded screw(s) 23. The housing also includes a ring 18 extending from the outer surface of the peripheral wall 13, to which a lanyard or a carabiner can be attached.

In various embodiments, the housing is made of a thermoplastic material, and preferably a material that can be molded into a desired shape. Non-limiting examples of the plastic material include polyethylene, polypropylene, polycarbonate, acrylic, vinyl, and other equivalent polymers, and can be either transparent, translucent, or opaque, and can be a non-colored or colored material. In some embodiments, the housing is molded from a black thermoplastic material in the cylindrical shape of a hockey puck.

The PCB includes the detection circuit 32, the microcontroller 40, the power supply 26, and the plurality of LED lights 70. The antenna 34 is in electronic communication with the detection circuit 32. The detection circuit 32 is in electronic communication with the microcontroller 40. The microcontroller 40 is in electronic communication with one or more of the plurality of LED lights 70. The power supply 26 is in power-delivery connection and/or electronic communication with the antenna 34, the detection circuit 32, the microcontroller 40, the plurality of LED lights 70, and any other electronic component.

Figure 3:
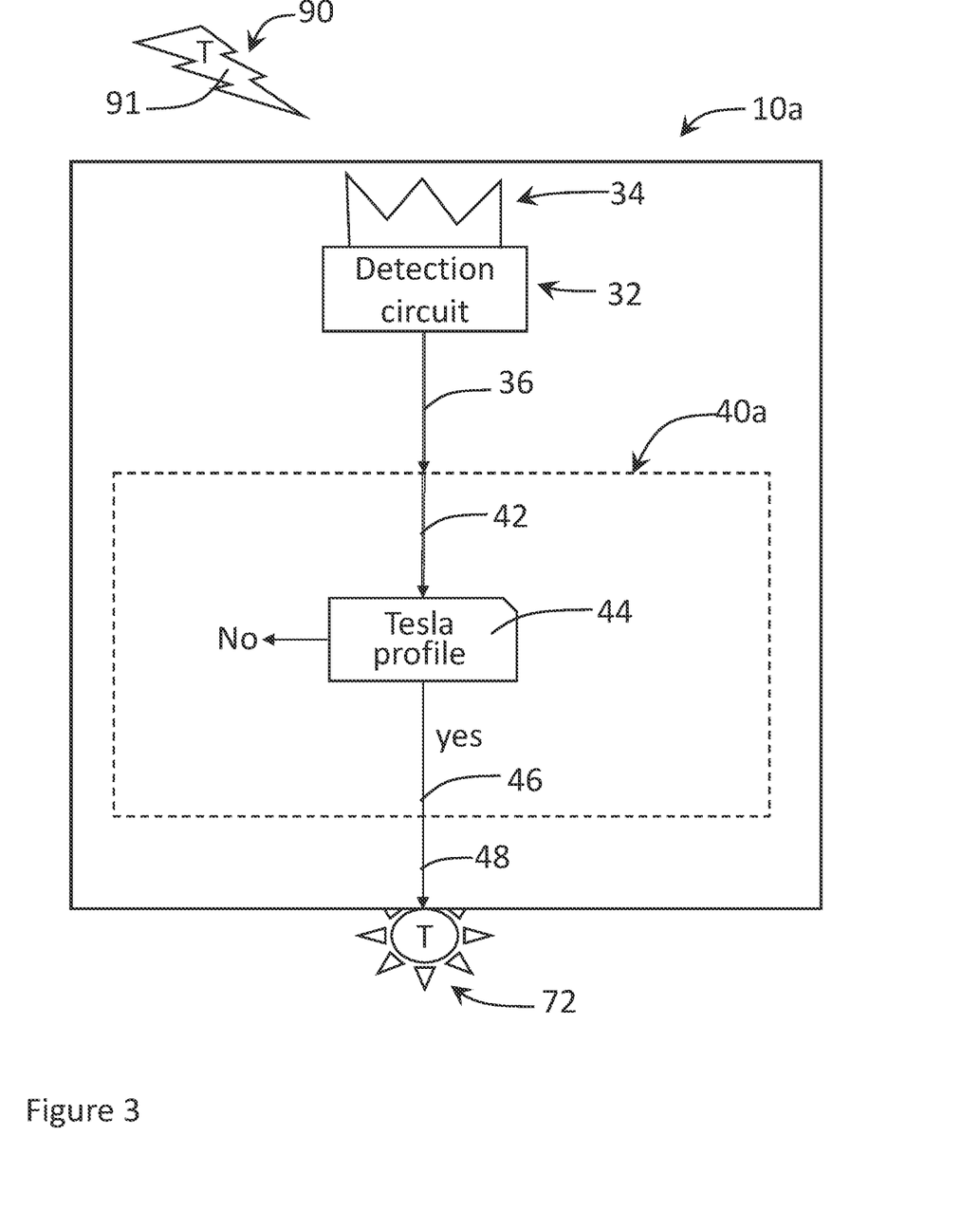
FIG. 3 shows a schematic of the tesla coil pulse detector, including the detection circuit, the microcontroller having a tesla profile, and the tesla coil alert, for detecting a tesla coil pulse and activating the tesla coil alert.

As shown schematically in FIG. 3, an antenna 34 is provided as a means for acquiring one or a plurality of electromagnetic pulses 90, which passes a signal or signals that correspond to the lightning pulse, which is received by the detection circuit 32. A non-limiting example of an antenna is a SFD300-HG antenna chip, and a non-limiting example of a detection circuit is an AS3935 Lightning Sensor chip. The detection circuit interprets the signals, and generates an output signal corresponding to an observed electromagnetic pulse, which is either natural lighting or a tesla coil generated pulse. The antenna 34 and the detection circuit 32 are configured to acquire and detect an observed electromagnetic pulse from either, or both, of a tesla coil generator and from natural lightning. In various embodiments, antenna 34 and the detection circuit 32 are configured to acquire and detect an observed electromagnetic pulse having a frequency at least within a range of 50 kilohertz (kHz) to 30 megahertz (MHz), which is the typical range for the output from a tesla coil pulse generator, and of natural lightning.

Non-limiting examples of a detection device for an electromagnetic pulse, such as a lighting pulse, are described in U.S. Pat. Nos. 3,891,919, 4,272,720, 5,263,368, 5,541,501, 7,049,972, 7,254,484, 7,266,455, 7,327,271, 7,772,826, 8,275,548, and US Patent Publications 20030151398 A1, 20090164124 A1, 20120154971 A1, the disclosures of which are incorporated by reference in their entireties.

The detection circuit 32 is configured to generate an output signal that corresponds, or correlates, to one or more of the frequency, pulse duration, and amplitude of observed electromagnetic pulse 90. In various embodiments, the output signal is a digital signal that can include a digital frequency pattern that corresponds to the frequency pattern of the electromagnetic pulses that have been detected. In some embodiments, the output signal is a digital signal that can include a pulse duration pattern that corresponds to the duration pattern of one or more of the electromagnetic pulses that have been detected. In some embodiments, the output signal is a digital signal that can include an amplitude that corresponds to the amplitude of one or more of the electromagnetic pulses that have been detected. In some embodiments, the output signal is a digital signal that includes both a digital frequency pattern that corresponds to the frequency pattern of the electromagnetic pulse, and a pulse duration that corresponds to the pulse duration of the electromagnetic pulse, where the electromagnetic pulses are from a tesla coil generator or natural lightning. In some embodiments, the output signal is a digital signal that includes a digital frequency pattern that corresponds to the frequency pattern of the electromagnetic pulses, a pulse duration that corresponds to the pulse duration of the electromagnetic pulses, and an amplitude: signal that corresponds to the amplitude of the electromagnetic pulses, wherein the electromagnetic pulses are from a tesla coil generator or natural lightning.

The microcontroller includes processing memory and data storage memory. In various embodiments, the microcontroller can include data storage memory of profile data for an electromagnetic pulse. In some embodiments, as shown in FIG. 3, the microcontroller 40 includes a tesla profile 44 including electromagnetic pulse pattern data. The pattern data of the tesla profile 44 matches or correlates with an output signal generated by the detection circuit 32 in response to the detection of a tesla coil pulse 91 from a tesla coil generator. The tesla profile 44 can include profile data for the frequency of a tesla coil pulse, or for the duration of a tesla coil pulse, or for both the frequency and the duration of a tesla coil pulse.

In an embodiment where the microcontroller 40 includes a tesla profile 44 saved on the data storage memory, the microprocessor 40 also includes receiving the output signal 36 from the detection circuit 32 as input signal 42, and processing the input signal 42 by comparing the input signal 42 with the tesla profile 44. If the digital frequency pattern and/or pulse duration of the input signal 42 matches the frequency pattern and/or the duration of the tesla profile 44, then a tesla coil indication 46 signal is generated by the microcontroller 40. If the digital frequency pattern and/or pulse duration of the input signal 42 does not match the frequency pattern and/or the duration of the tesla profile 44, then a tesla coil indication 46 signal is not generated by the microcontroller 40. In various embodiments, both the digital frequency pattern and the pulse duration of the input signal 42 must match the frequency pattern and the duration pattern of the tesla profile 44, for a tesla coil indication 46 signal to be generated by the microcontroller 40.

In various embodiments, the microcontroller 40 identifies a detected electromagnetic pulse as a tesla coil pulse when the observed electromagnetic pulse has a frequency within the range of 50 kHz to 300 MHz, with a pulse duration of at least 0.50 seconds. The pulse duration limitation allows the microcontroller 40 to distinguish a tesla coil pulse from natural lightning that has pulse durations well less than 250 msec. The microcontroller 40 then generates an indication of the detected electromagnetic pulse, the indication comprising a tesla coil indication 46, shown in FIG. 3.

In various embodiments, the portable electronic device 10*a* further includes a tesla coil alert, illustrated as a tesla light-emitting diode (LED) 72 that is actuated to emit light when the microcontroller 40 generates a tesla coil indication 46. The microcontroller 40 can be configured to actuate and sustain the actuation of the tesla LED 72 during the entire pulse duration of the tesla coil pulse 91. In other embodiments, the microcontroller 40 can be configured to actuate the tesla LED 72 in a predetermined or preselected pattern of light emissions of the same or of different light frequencies (visible colors), for a period of time or in a series or sequence, independent to the pulse duration of the tesla coil pulse 91.

In various embodiments, the tesla coil alert can be selected from the group consisting of a light, the light-emitting diode (LED), a buzzer, a gauge, a horn, a vibrator, a shaker and a combination thereof, to provide respective visual, audible, or tactile feedback to the electromagnetic pulse from a tesla coil. Likewise, in various embodiments, the microcontroller 40 can be configured to actuate and sustain the actuation of the tesla coil alert during the entire pulse duration of the tesla coil pulse 91, while in other embodiments, the microcontroller 40 can be configured to actuate the tesla coil alert in a predetermined or preselected pattern of light emissions of the same or of different light frequencies (visible colors), for a period of time or in a series or sequence, independent to the pulse duration of the tesla coil pulse 91.

The LED lights can be of any one or a plurality of colored LEDs, or each LED can comprise a multicolor LED that can be controlled a emit multiple lights frequencies.

Figure 4:
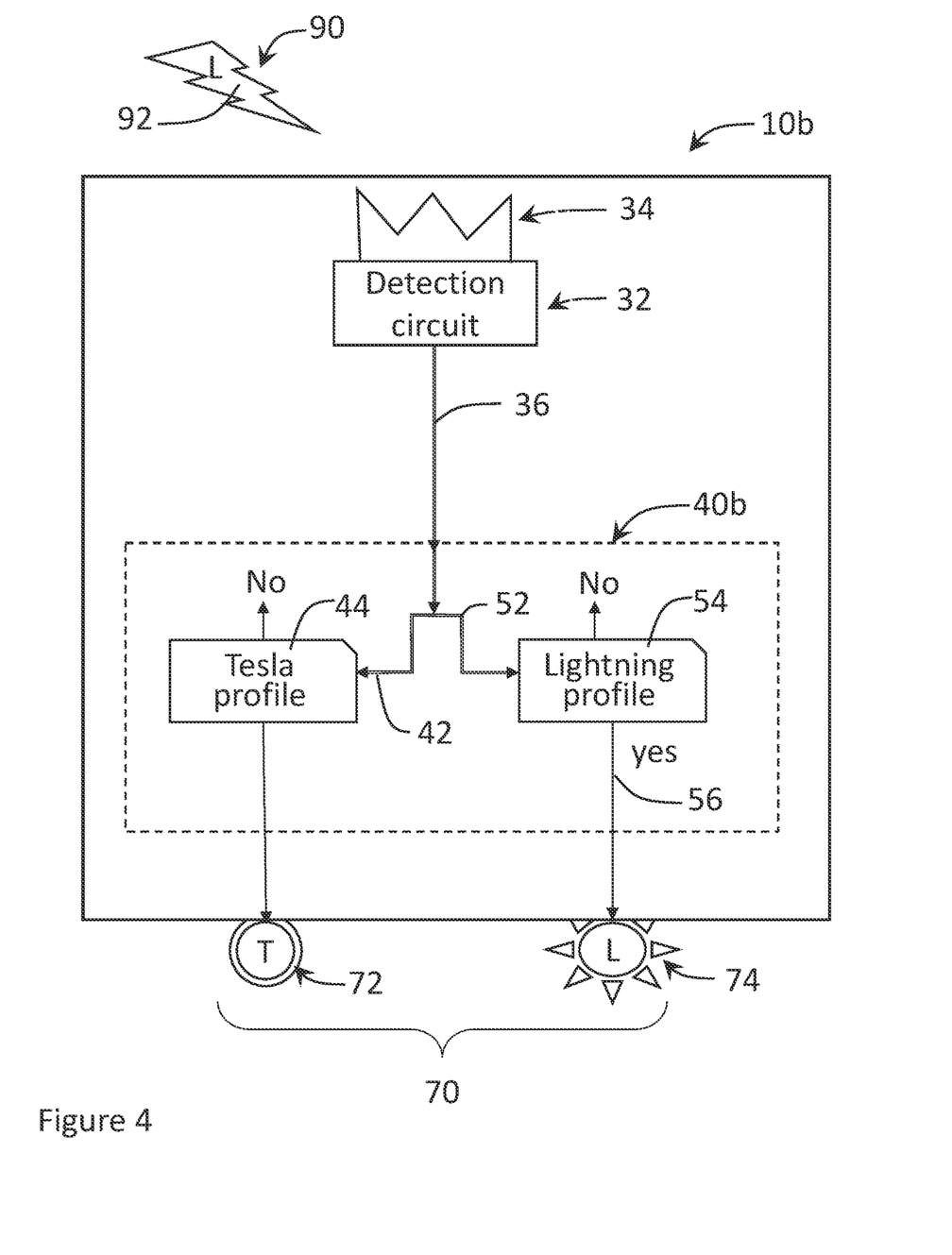
FIG. 4 shows a schematic operating system of an alternative embodiment of a tesla coil pulse detector, where the microcontroller also has a lightning profile, and a lightning alert, for detecting the tesla coil pulse and activating the tesla coil alert, and/or detecting the lightning pulses and activating the lightning alert.

In some embodiments, illustrated in FIG. 4, the profile data comprises a lightning profile 54 including electromagnetic pulse pattern data that matches or correlates with an output signal 36 generated from natural lightning 92. The lightning profile 54 can include profile data for the frequency of the natural lightning pulse, or for the duration of the natural lightning pulse, or for both the frequency and the duration of the natural lightning pulse. In some embodiments, as illustrated in FIG. 4, the microcontroller 40 includes both a tesla profile 44 and a lightning profile 54 saved on the data storage memory.

In an embodiment where the microcontroller 40 includes a lightning profile 54 saved on the data storage memory, the microprocessor 40 also includes receiving the output signal 36 from the detection circuit 32 as input signal 52, and processing the input signal 52 by comparing the input signal 52 with the lightning profile 54. If the digital frequency pattern and/or pulse duration of the input signal 52 matches the frequency pattern and/or the duration of the lightning profile 54, then a lightning indication 56 signal is generated by the microcontroller 40. If the digital frequency pattern and/or pulse duration of the input signal 52 does not match the frequency pattern and/or the duration of the lightning profile 54, then a lightning indication 56 signal is not generated by the microcontroller 40. In various embodiments, both the digital frequency pattern and the pulse duration of the input signal 52 must match the frequency pattern and the duration pattern of the lightning profile 54, for a lightning indication 56 signal to be generated by the microcontroller 40.

In various embodiments, the detected electromagnetic pulse is identified as natural lightning by the microcontroller 40 and the lightning profile 54 when the observed electromagnetic pulse 92 has a pulse duration or pulse durations within a range of 10 to 250 milliseconds (msec), or when the observed electromagnetic pulse has pulse frequencies that include frequencies within a range of about 10 kHz to about 600 kHz, including about 450 kHz to about 550 kHz, and more typically about 500±17 kHz, or when the observed electromagnetic pulse has both a pulse duration or pulse durations within a range of 10 to 250 milliseconds (msec), and a frequency within the above range.

Figure 2:
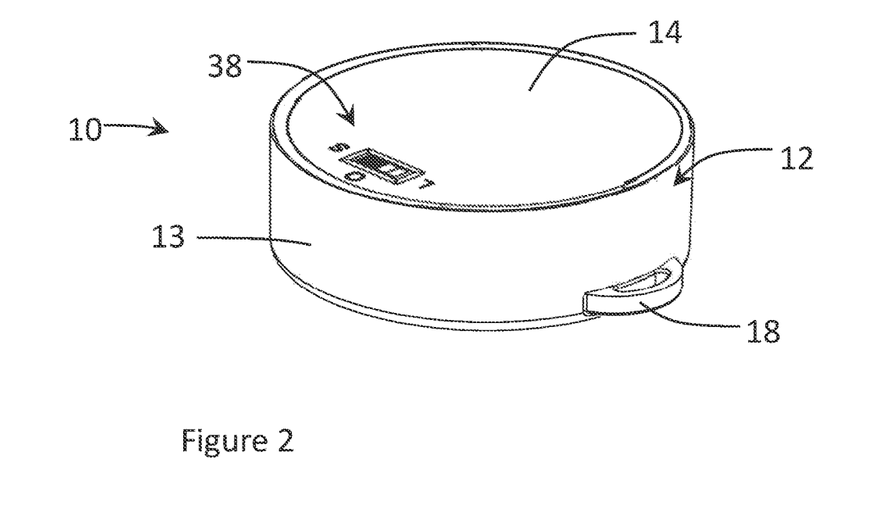
FIG. 2 shows a perspective view of the assembled tesla coil pulse detector with the selector switch in the outer surface of the circular base through which the sliding switch extends.
Figure 5:
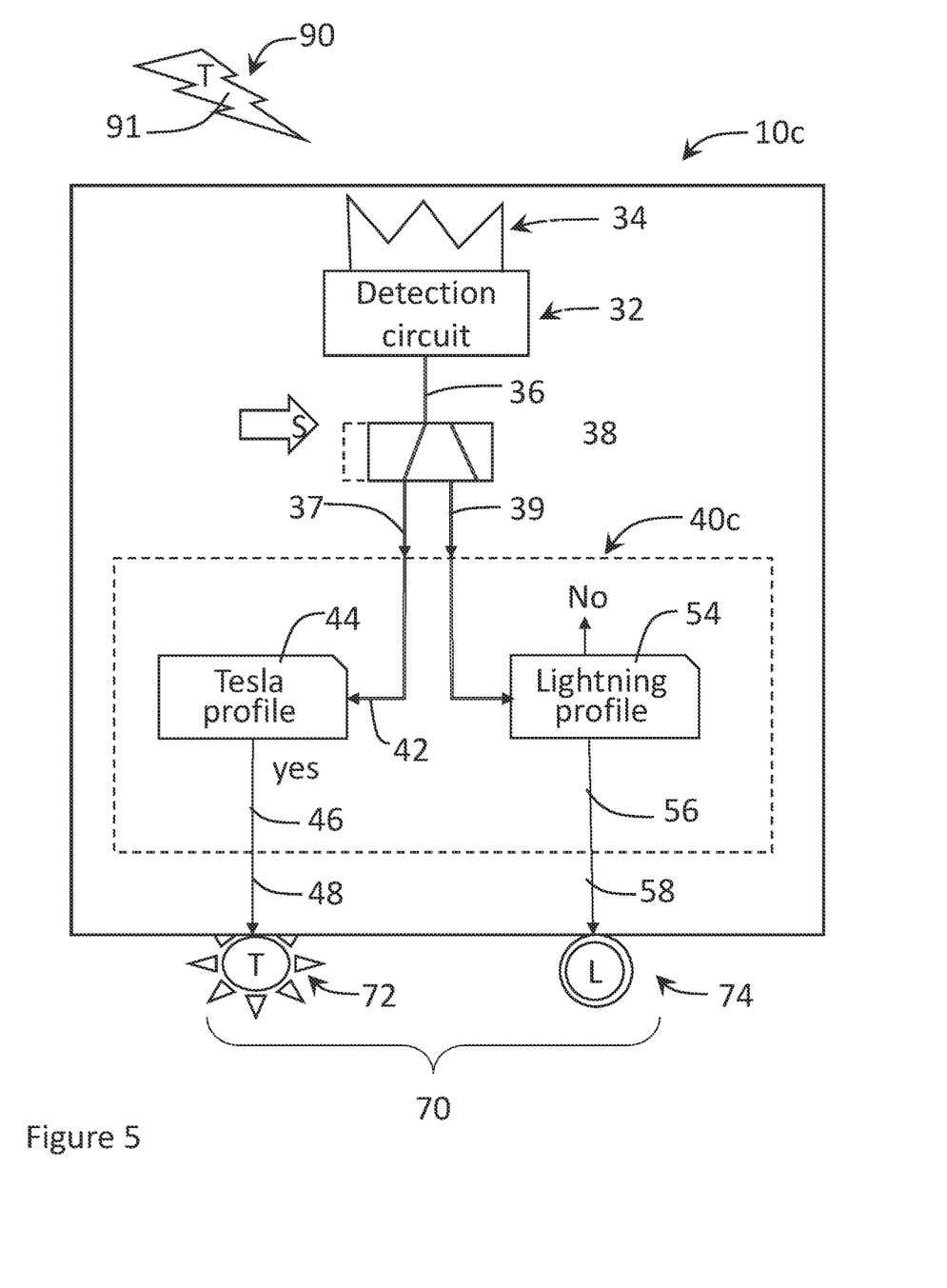
FIG. 5 shows the schematic operating system of another alternative embodiment of the tesla coil pulse detector that includes a switch for selecting either the tesla profile or the lightning profile, where the switch is illustrated in the tesla coil mode for detecting a tesla coil pulse and activating the tesla coil alert.
Figure 6:
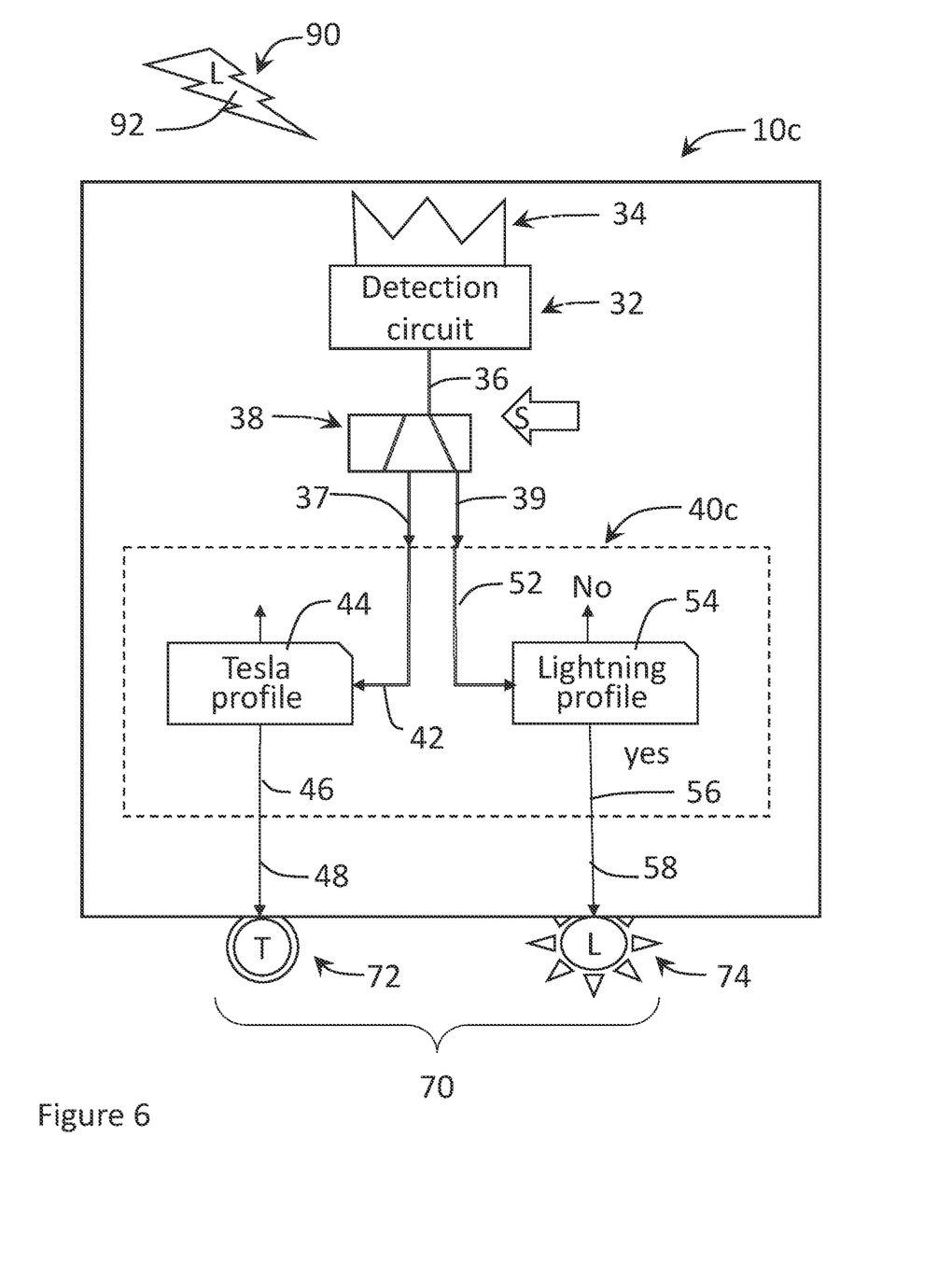
FIG. 6 shows the schematic operating system of the tesla coil pulse detector of FIG. 5, where the switch is illustrated in the lightning mode for detecting natural lighting and activating the lightning alert.

In various embodiments, the portable electronic device further includes an indication selector for selecting either a tesla pulse mode or a natural lightning mode. FIG. 5 shows a portable electronic device 10c that has an indication selector. The indication selector is configured to move between a first position or condition to provide the tesla pulse mode, and a second position or condition to provide the natural lightning mode. In the illustrated embodiment, the indication selector is a three-position sliding switch 38 that can be manipulated manually between at least the first position, an off position, and the second position. The sliding switch 38 is positioned on an outside of the housing 12, typically extending through the circular base 14, as shown in FIG. 2, or through other surface or element of the portable electronic device 10c, to allow the user to slide and select the position of the sliding switch 38 with a finger between the first position ("L", for lightning), the off position ("O"), and the second position ("S", for stadium). The switch is preferable positioned along the peripheral edge to make it easier for the users finger to locate the switch. The movement of the sliding switch 38 to the first position places the device into a tesla pulse mode, and communicates the output signal 36 from the detection circuit 32 to a first selector output 37, as shown in FIG. 5. The first selector output 37 is then passed as an input signal 42 into the tesla profile 44. The movement of the sliding switch 38 to the second position places the device into a lightning mode, and communicates the output signal 36 from the detection circuit 32 to a second selector output 39, as shown in FIG. 6. The second selector output 39 is then passed as an input signal 52 into the lightning profile 54.

In the first position or tesla pulse mode, if a tesla coil indication 46 is generated by the microprocessor 40c as a result of a tesla coil pulse 91 being detected, as described above and shown in FIG. 3, the tesla coil alert is activated, illustrated in FIG. 5 as a tesla coil LED alert 72, to emit a light. The microcontroller 40c can be configured to actuate and sustain the actuation of the tesla coil LED alert 72 during the entire pulse duration of the tesla coil pulse 91. In other embodiments, the microcontroller 40 can be configured to actuate the tesla coil LED alert 72 in a predetermined or preselected pattern of light emissions, independent to the pulse duration of the tesla coil pulse 91.

In the second position or natural lighting mode, if a lightning indication 56 is generated by the microprocessor 40c as a result of a lightning pulse 92 being detected, the lightning alert is activated, illustrated in FIG. 6 as a lightning LED alert 74, to emit a light. The microcontroller 40c can be configured to actuate and sustain the actuation of the lightning LED alert 74 during the entire pulse duration of the lightning pulse 92. In other embodiments, the microcontroller 40 can be configured to actuate the lightning LED alert 74 in a predetermined or preselected pattern of light emissions, of the same or of different light frequencies (visible colors), for a period of time or in a series or sequence, independent to the pulse duration of the lightning pulse 92.

In various embodiments, either the tesla coil alert or the lightning alert, or both, can be selected from the group consisting of a light, the light-emitting diode (LED), a buzzer, a gauge, a horn, a vibrator, a shaker, and a combination thereof, to provide respective visual, audible, or tactile feedback to the electromagnetic pulse from a tesla coil. Likewise, in various embodiments, the microcontroller 40 can be configured to actuate and sustain the actuation of the tesla coil alert or the lightning alert, or both, during the entire pulse duration of the respective tesla coil pulse 91 or lightning pulse 92, while in other embodiments, the microcontroller 40 can be configured to actuate independently the tesla coil alert or the lightning alert, or both, in a predetermined or preselected pattern of light emissions, of the same or of different light frequencies (visible colors), for a period of time or in a series or sequence independent to the pulse duration of the respective tesla coil pulse 91 or lightning pulse 92.

Figure 7:
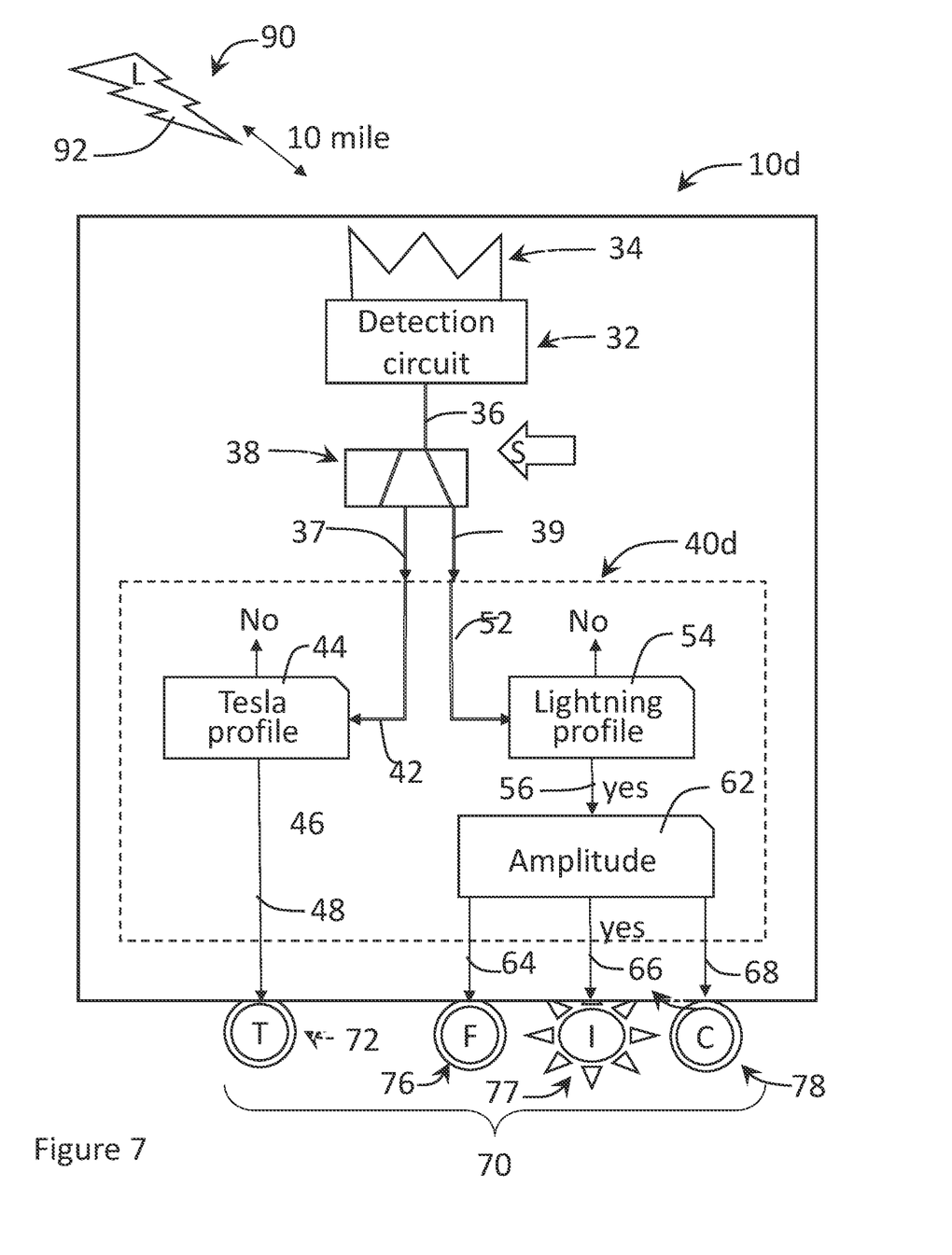
FIG. 7 shows a schematic operating system of a further alternative embodiment of the tesla coil pulse detector of FIG. 4, when the selector switch is positioned in the lightning mode, and where the microcontroller also has a pulse amplitude sensor, for detecting natural lighting and the amplitude of the lightning pulse, and activating one or a plurality of lightning distance alerts.

In various embodiments, the microcontroller further operates to analyze an amplitude of the output signal from the detection circuit to provide an estimate of the distance of the native electromagnetic pulse of natural lightning from the position of the detector itself. As shown in FIG. 7, a microcontroller 40d can include an amplitude algorithm 62 for measuring an amplitude signal in an output signal 36 from the detection circuit 32 that corresponds to the amplitude of the electromagnetic pulses, for example, the electromagnetic pulses of natural lightning 92, and generating a lightning indication 56 signal that includes an amplitude indication that corresponds to the amplitude signal in the output signal 36 of the detection circuit 32. The amplitude algorithm also compares the amplitude indication with two or more predetermined sets of amplitude, and more typically three predetermined sets of amplitude, each set representing a respective range of estimated distances of the native electromagnetic pulse of natural lightning from the position or location of the detector itself.

The distance of a detected lightning strike 92 from the lightning detection circuit 32 is typically estimated by detecting and measuring the amplitude of the lightning signal received, and correlating the signal amplitude to an estimated distance (illustrated as 10 miles, or 16 kilometers) of the lighting source (92) from the detector 10d.

The amplitude algorithm can assign lightning pulses in a lowest amplitude range to a designated farthest (F) distance, for example, about 17 miles to 25 miles (27 to 40 kilometers), generate a farthest indication signal 64, and activate a farthest distance alert, illustrated as farthest LED alert 76. In some embodiments, farthest LED alert 76 can comprise emitting a green, and more preferably flashing or pulsing green light, from the one or more, and preferably several, LEDs 70. The green light warns of the detection of distant though possibly approaching lightning strikes.

The amplitude algorithm will typically assign lightning pulses in an intermediate amplitude range to a designated intermediate (I) distance, for example, about 7 miles to about 16 miles (about 11 to 27 kilometers), generate an intermediate indication signal 66, and activate an intermediate distance alert, illustrated as intermediate LED alert 77. In some embodiments, the intermediate LED alert 77 can comprise emitting a blue, and more preferably flashing or pulsing blue light, from the one or more, and preferably several, LEDs 70. The blue light warns of the detection of lightning strikes that are approaching.

The amplitude algorithm will typically assign lightning pulses in a highest amplitude range to a designated closest (C) distance, for example, up to about 6 miles (up to 10 kilometers), generate a closest indication signal 68, and activate a closest distance alert, illustrated as closest LED alert 78. In some embodiments, closest LED alert 78 can comprise emitting a red, and more preferably flashing or pulsing red light, from the one or more, and preferably several, LEDs 70. The red light more urgently warns that the detected lightning strikes are overhead or nearby.

A lighting detection circuit of a lightning detector, or a tesla coil pulse detector that includes a detection circuit for detecting natural lighting, can be calibrated or checked for accuracy by accessing lightningmaps.org or similar websites, which show in real-time (with perhaps a 1 second delay) several detection sites on a map of a signal of any lightning that is picked up by the detector at that location. The software then estimates a location for any lighting pulse by correlation among multiple detectors (often up to 8 or 9 detecting points) and plotting an estimated location based on the various detected signals.

The tesla coil pulse detector 10 shown in FIG. 1 also includes the lens 20 that attaches to the housing 12. In various embodiments, the lens 20 is made of a light-transmissive material, typically a thermoplastic, and is molded or formed with an outer face 21, and a rear surface that includes a means for attaching the lens 20 to the upper circular edge 16 of the peripheral wall 13 of the housing 12. The light-transmissive material of the lens allows light emitted by the one or plurality of lights 70 within the housing 12 to pass through the lens 20 and illuminating the face 21, to be visible from the outside. In various embodiments, the light transmissive material of the lens 20 and the face 21 is translucent or transparent, and preferably is a colorless translucent material. In various embodiments, the inside or outside surface of the face 21 can be painted, embossed, stickered, or labeled with letters, logos, or marks, such as team and event logos. In various embodiments, the outside surface of the face 21 can be formed or molded with a three-dimensional pattern, for example, a pattern of dimples to simulate a golf ball, laces to simulate a baseball, and others. The thermoplastic material can be any well-known material, such as polyethylene, polypropylene, polycarbonate, acrylic, vinyl, and other equivalent polymers.

We claim:

1. A portable electronic device for detecting an electromagnetic pulse generated by a tesla coil, comprising:
   i) a detection circuit for an electromagnetic pulse, operating to detect an observed electromagnetic pulse having a frequency at least within a range of about 50 kilohertz (kHz) to about 300 megahertz (MHz), and to generate an output signal corresponding to the observed electromagnetic pulse, and
   ii) a microcontroller coupled to the detection circuit, the microcontroller operating to analyze the output signal from the detection circuit against a tesla profile that identifies a detected electromagnetic pulse as a tesla coil pulse when the observed electromagnetic puke has a frequency within the range of about 50 kHz to about 300 MHz with a pulse duration of at least 0.50 seconds, and to generate an indication of the detected electromagnetic pulse, the indication comprising a tesla coil indication.

2. The portable electronic device of claim 1 wherein the portable electronic device further includes an alert comprising a tesla coil alert that is actuated when the indication is a tesla coil indication.

3. The portable electronic device of claim 2 wherein the tesla coil alert is selected from the group consisting of a light, a light-emitting diode (LED), a buzzer, a gauge, a horn, a vibrator, a shaker, and a combination thereof, to provide visual, audible or tactile feedback to the electromagnetic pulse from a tesla coil.

4. The portable electronic device of claim 1 wherein the detection circuit further operates to detect an observed electromagnetic pulse corresponding to natural lightning.

5. The portable electronic device of claim 4 wherein the microcontroller further operates to analyze the output signal from the detection circuit against a lightning profile that identifies the detected electromagnetic pulse as natural lightning, and to generate a lightning indication.

6. The portable electronic device of claim 5 wherein the lightning profile further identifies the detected electromagnetic pulse as natural lightning when the observed electromagnetic pulse has a pulse duration within a range of 10 to 250 milliseconds (msec).

7. The portable electronic device of claim 6 wherein the lightning profile further identifies the detected electromagnetic pulse as natural lightning when the observed electromagnetic pulse has a frequency of about 450 kHz to about 550 kHz.

8. The portable electronic device of claim 7 wherein the portable electronic device further includes an indication selector for selecting either a tesla coil position or a lightning position, wherein when the indication selector is in the tesla coil position, a generated tesla coil indication activates a tesla coil alert, and when the indication selector is in the lightning position, a generated lightning indication activates a lightning alert.

9. The portable electronic device of claim 8 wherein the tesla coil alert and the lightning alert are each independently selected from the group consisting of a light, a light-emitting diode (LED) a buzzer, a gauge, a horn, a vibrator, a shaker, and a combination thereof, to provide visual, audible, or tactile feedback to the electromagnetic pulse from, respectively, a tesla coil and lightning.

10. The portable electronic device of claim 5 wherein the microcontroller further operates to analyze an amplitude of the output signal from the detection circuit to provide an estimate of the distance of the detected electromagnetic pulse of natural lightning.

11. The portable electronic device of claim 10 wherein the microcontroller compares the amplitude of the output signal from the detection circuit to two or more predetermined sets of amplitudes, each representing a respective range of estimated distances of the detected electromagnetic pulse of natural lightning.

12. The portable electronic device of claim 11 wherein the microcontroller includes at least three predetermined sets of amplitudes, corresponding to at least three ranges of estimated distances detected electromagnetic pulse of natural lightning.

13. The portable electronic device of claim 12 wherein the first set of amplitudes comprises a farthest range of estimated distance, the second set of amplitudes comprises an intermediate range of estimated distance, and the third set of amplitudes comprises a closest range of estimated distance detected electromagnetic pulse of natural lightning.

14. A method for detecting an electromagnetic pulse generated by a tesla coil, comprising the steps of:
   i) detecting an observed electromagnetic pulse at least within a range of about 50 kilohertz (kHz) to about 300 megahertz (MHz), and having a pulse duration;
   ii) generating an output signal corresponding to the observed electromagnetic pulse;
   iii) analyzing the output signal against a tesla profile that identifies the detected electromagnetic pulse as a tesla coil pulse when the observed electromagnetic pulse has a frequency within the range of about 50 kHz to about 300 MHz with a pulse duration of at to least 0.50 seconds;

iv) generating an indication comprising a tesla coil indication; and v) actuating an alert comprising a tesla coil alert when the indication is the tesla coil indication.

15. The method of claim 14, for further detecting natural lightning and distinguishing an observed electromagnetic pulse of an electromagnetic pulse generated by a tesla coil from natural lighting, wherein:

a) the step of analyzing the output signal further includes analyzing the output signal against a lightning profile that identifies the detected electromagnetic pulse as natural lightning when the observed electromagnetic pulse has a pulse duration within a range of 10 to 250 milliseconds (msec);

b) generating a lightning indication; and c) actuating a lightning alert when the indication comprises the lightning indication.

16. The method of claim 14, wherein the step of actuating further includes providing a means for selecting either a tesla coil indication or a lightning indication, wherein when the tesla coil indication is selected, only the tesla coil alert is actuated, and when the lightning indication is selected, only the lightning alert is actuated.

* * * * *